United States Patent [19]
Becker et al.

[11] Patent Number: 5,756,216
[45] Date of Patent: *May 26, 1998

[54] HIGHLY SELECTIVE NITRIDE SPACER ETCH

[75] Inventors: David S. Becker; David J. Keller, both of Boise, Id.

[73] Assignee: Micron Technology, Inc., Boise, Id.

[*] Notice: The term of this patent shall not extend beyond the expiration date of Pat. No. 5,700,580.

[21] Appl. No.: 799,575

[22] Filed: Feb. 12, 1997

Related U.S. Application Data

[63] Continuation of Ser. No. 301,928, Sep. 7, 1994, Pat. No. 5,700,580, which is a continuation-in-part of Ser. No. 89,205, Jul. 9, 1993, Pat. No. 5,387,312.

[51] Int. Cl.$^6$ .................................................. H01L 21/306
[52] U.S. Cl. ............... 428/446; 156/643.1; 156/646.1; 156/650.1; 156/651.1; 156/653.1; 156/662.1; 156/625.1; 428/698; 428/938
[58] Field of Search .......................... 156/643, 650, 156/651, 652, 653, 662.1, 650.1, 651.1, 653.1, 643.1, 646.1; 428/446, 698, 938

[56] References Cited

U.S. PATENT DOCUMENTS

| | | | |
|---|---|---|---|
| 4,568,410 | 2/1986 | Thornquist | 156/643 |
| 4,793,897 | 12/1988 | Dunfield et al. | 156/643 |
| 5,338,395 | 8/1994 | Keller et al. | 156/643 |
| 5,374,585 | 12/1994 | Smith et al. | 437/69 |

FOREIGN PATENT DOCUMENTS

| | | |
|---|---|---|
| 0283306 | 9/1988 | European Pat. Off. . |
| 0414372 | 2/1991 | European Pat. Off. . |
| 235134 | 4/1986 | Germany . |
| 54-125979 | 9/1979 | Japan . |
| 60-246636 | 12/1985 | Japan . |

OTHER PUBLICATIONS

"Thin Film Investigations and Sputter Etchng"–Emmoth et al; Annual Report–Res. Inst. Phys. (Swed) 1979; abstract only.

"Highly Selective Etching of Silicon Nitride ($Si_3N_4$) to Silicon Dioxide Employing Fluorine and Chlorine Atoms Generated by Microwave Discharge"–J. Electrochem. Soc; vol. 136, No. 7; 7–89; pp. 2032–2034 Suto et al.

"Selective Etching of Silicon Nitride Using Remote Plasmas of CF4 and SF6" J. Vac. Sci., A. vol. 7 No. 3, pt. 1; Loewenstein 5–89; abstract only.

*Primary Examiner*—Fred Zitomer

[57] ABSTRACT

A method is provided for forming a nitride spacer, in which a layer of oxide is grown superjacent a substrate and the semiconductor features disposed thereon. A layer of nitride is deposited superjacent the oxide layer, and a major horizontal portion of the nitride layer anisotropically etched with an ionized fluorocarbon compound. The remainder of the horizontal portion of the nitride layer is removed with $NF_3$ ions in combination with ionized halogen-containing compound, thereby creating nitride spacers adjacent the features.

9 Claims, 2 Drawing Sheets

HIGHLY SELECTIVE NITRIDE SPACER ETCH

This application is a continuation of U.S. patent application Ser. No. 08/301,928, now U.S. Pat. No. 5,700,580, filed Sept. 7, 1994, which was a continuation-in-part of U.S. patent application Ser. No. 08/089,205 filed Jul. 9, 1993, now U.S. Pat. No. 5,387,312 issued Feb. 7, 1995.

Field of the Invention

This invention relates to semiconductor manufacturing, and more particularly to a process for the formation of nitride spacers employing a selective nitride to oxide etch.

BACKGROUND OF THE INVENTION

"Spacers" are frequently used in semiconductor manufacturing as protective structures against subsequent processing steps. In particular, spacers are used to protect underlying source/drain areas during doping or implanting steps. The dopant material is unable to penetrate the spacer, and thus, the underlying layer remains relatively unaffected by the implanted material.

As semiconductor devices (e.g., transistors) become smaller, the spacers disposed along side them must also become smaller. Spacer formation typically involves etching, and research continues for ever better and cleaner etching processes.

In transistor formation, a nitride spacer is commonly disposed over the source/drain regions during implant steps. Some of the current processes are limited to spacer thicknesses which are only twice the thickness of the underlying oxide. See, for example, Japanese patent 5-299394 which proposes an etch process having a 2:1 nitride to oxide selectivity. This limitation with respect to nitride to oxide selectivity also limits the possible size and thickness of the nitride spacer.

SUMMARY OF THE INVENTION

The present invention relates to use of a thin oxide layer (i.e., the source/drain reoxidation layer) under a deposited nitride layer to act as an etch stop during the formation of the spacer. The use of a highly selective nitride to oxide etch prevents the nitride etch from removing the thin oxide layer, and consuming the underlying silicon in the sensitive source/drain areas of the transistor.

The process of the present invention therefore, provides a unique nitride etch that is suitable for etching submicron features, while stopping on a thin oxide layer without pitting the underlying silicon.

The present invention provides a process for forming nitride spacers by forming features on a substrate, the features having horizontal and vertical surfaces, and growing an oxide layer superjacent the features. The oxide layer is conformal. A nitride layer is deposited superjacent the oxide layer. The nitride layer is conformal. Spacers are formed from the nitride layer. The spacers are disposed adjacent the features, and have a thickness which is greater than twice the thickness of the oxide layer.

One advantage of the process of the present invention is that it enables a wide range of oxide thicknesses. The present invention provides the ability to adjust the thickness of the thin oxide (source/drain reoxidation) layer with minimal adjustment to the thickness of the nitride layer, and the subsequent nitride spacer.

Another advantage of the selective nitride spacer etch of the present invention is the ease of process measurements as compared to typical nitride spacer etches. All that is required to insure the nitride has been removed, in the process of the present invention, is a measurement of the thin oxide layer after the etch process is complete, in order to determine if the etch has partially penetrated into the source/drain reoxidation layer.

A further advantage of the process of the present invention, is the ability to adjust the spacer thickness. Control of the dimensions of the spacers enables the engineer to control the dimensions of the underlying implant regions. The ability to space the implant area away from the transistor allows the voltage threshold (VT) to be adjusted to optimize the electrical performance of the transistor.

Brief Description of the Drawings The present invention will be better understood from reading the following description of nonlimitative embodiments, with reference to the attached drawings, wherein below:

DETAILED DESCRIPTION OF THE INVENTION

The process of the present invention is described and illustrated with respect to a DRAM transistor structure. However, one having ordinary skill in the art, upon being apprised of the invention, in hindsight would be able to apply it to other semiconductor devices, such as, but not limited to EPROMS, EEPROMS, and etc. The process of the present invention is not limited to the formation of spacers along gate structures, but is also adaptable to the formation of nitride spacers adjacent other semiconductor features.

Figure 1:
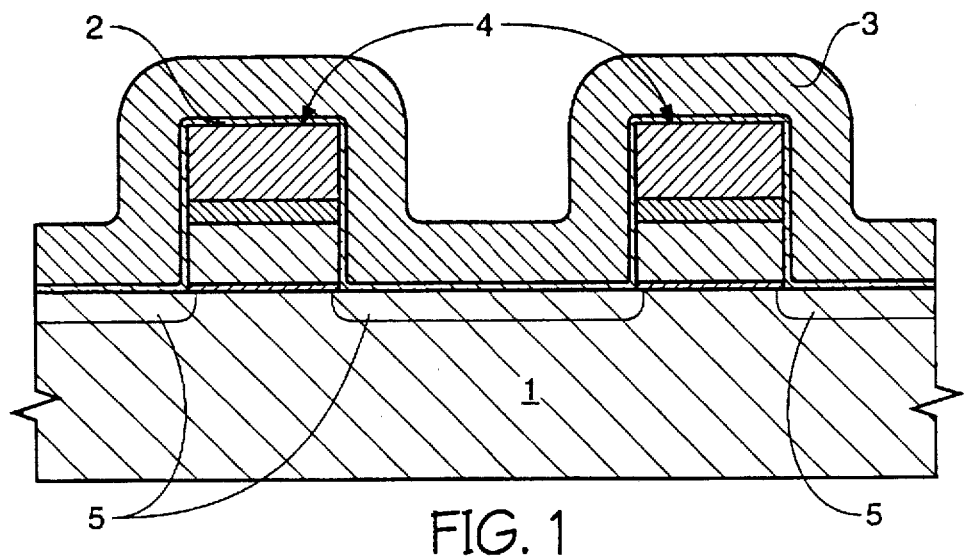
FIG. 1 is a schematic cross-section of a semiconductor gate device having oxide and nitride layers disposed thereon, according to the process of the present invention.

The formation of a nitride spacer using the selective nitride to oxide etch process of the present invention is as follows:

FIG. 1 illustrates a reoxidation 2 layer formed over transistor gate structures 4. The reoxidation layer 2 is a thin oxide layer which is preferably grown over the surface of the wafer 1. The source/drain reoxidation areas 5 are the locations of the future source/drain regions for their associated gate structures 4. The oxidation layer 2 has a thickness of less than approximately 150 Å, of which 70 Å is gate oxidation, and the additional amount is grown. Both values are adjustable to achieve the desired oxide 2 thickness.

A layer of silicon nitride 3 is disposed superjacent the thin reoxidation layer 2. The silicon nitride layer 3 has a thickness of approximately 1.6 KÅ. The oxide 2 and nitride 3 layers are preferably conformal in nature.

In this particular etch, layer 3 acts as a protective or resistant area to cover the future source/drain areas 5 during the subsequent implant or doping process. The nitride layer 3 is preferably conformally deposited. There are several methods commonly known in the art to accomplish such deposition.

Figure 2:
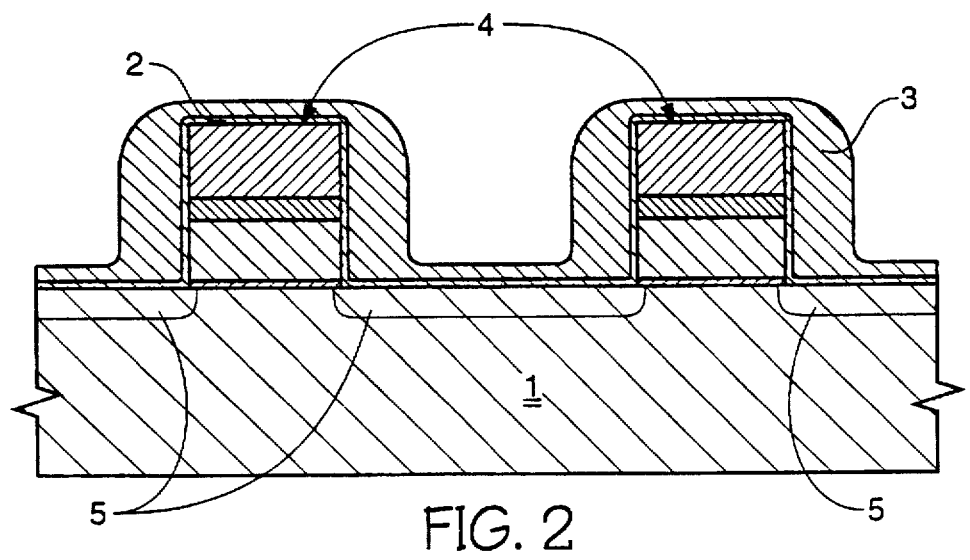
FIG. 2 is a schematic cross-section of the semiconductor gate device of FIG. 1, after a low selective nitride to oxide etch, according to the process of the present invention.
Figure 3:
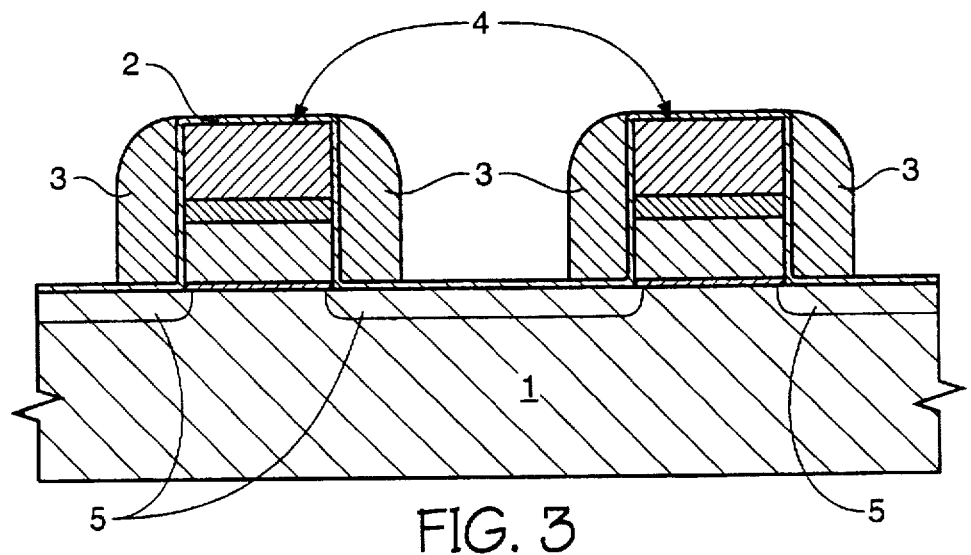
FIG. 3 is a schematic cross-section of the semiconductor gate device of FIG. 2, after a highly selective nitride to oxide etch, according to the process of the present invention.

The structure of FIG. 1 is then etched according to the process of the present invention to result in the structure depicted in FIG. 2. The etch of the present invention has a basis in the physical nature of the reaction, and more specifically, in ion bombardment.

Hence, the process of the present invention is most effective when performed in a chamber in which ions can be accelerated. Such chambers are known in the art, and include, but are not limited to, reactive ion etchers, preferably magnetically enhanced reactive ion etchers, and high density source etchers.

The present invention involves the physical impact of the ions which enables the reaction to proceed, as compared to a simple chemical reaction. While the invention anticipates chemical reaction, it uses the physical impact of the etchant chemical ions to enhance the uniformity of the etch process.

The process of the present invention comprises two etch steps, preferably performed in situ, i.e., in the same reaction chamber. The first step, is a low selective nitride to oxide etch which is used to remove a major portion of the nitride layer 3. Approximately 75% the thickness of the nitride is removed. In the preferred embodiment, approximately 1.4 KÅ of silicon nitride 3 is etched.

The preferred chemistry is approximately 50 sccm $CF_4$ and approximately 10 sccm $CHF_3$. The etch parameters are approximately 200 mtorr, at 600 Watts, and 100 Gauss.

Of course, one having ordinary skill in the art will realize that the above values will vary depending on the make and model of the etcher used in the process. The etch processes of the present invention were carried out in an Applied 5000 Magnetically Enhanced Reactive Ion Etcher, sold by Applied Materials Corporation of Santa Clara, Calif.

The low selective etch is an anisotropic etch, and therefore removes material in one direction, i.e., vertically. Hence, the nitride material 3 on the top of the gate structures 4 and along the surface of the substrate 1 is removed more quickly than the nitride material 3 on the sides of the gate structures 4. In this manner, "spacers" 3 are formed on either side of the semiconductor gate structures 4.

The process of the present invention, then employs a highly selective nitride to oxide etch to remove the remaining nitride 3 which is on the top portion of the gate structures 4 and also covering the thin oxide layer 2. The highly selective etch has an etch selectivity in the approximate range of 49:1. This means that the nitride 3 is removed at a rate 49 times faster than the oxide 2 is removed. The remaining nitride 3 in the preferred embodiment is approximately 200 Å, which is about 25% of the thickness of the deposited nitride layer 3.

The process is halted upon reaching the 150 Å of oxide layer 2 of the source/drain reoxidation The parameters for highly selective nitride to oxide etch phase of the present process are 500 mtorr, at 200 Watts, and 50 Gauss. Once again, these parameters will vary with the make and model of etcher employed in the process.

The nitride to oxide selective etch is accomplished by using an $NF_3$/HBr chemistry, as described more fully in U.S. Pat. No. 5,338,395 entitled, "Method for Enhancing Etch Uniformity Useful in Etching Submicron Nitride Features," having a common inventor with the present application, and assigned to Micron Semiconductor, Inc.

The etch chemistry comprises approximately 49 sccm $NF_3$, along with a hydrogen halide, such as, for example, HCl, HI, and HBr. The preferred embodiment employs approximately 21 sccm HBr.

The fluorine from the $NF_3$ gives a very fast nitride etch rate, while the bromine from the HBr gives a very slow oxide etch rate.

The process of the present invention results in a spacer which is substantially anisotropic. There is essentially no undercutting apparent in the nitride spacers 3. Thus, submicron features can be etched with considerable reliability.

Figure 4:
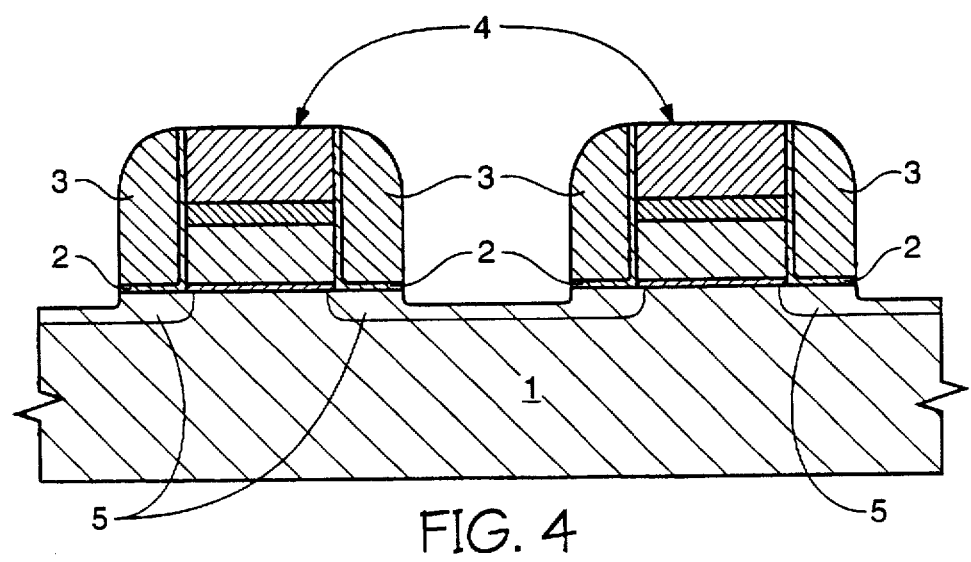
FIG. 4 is a schematic cross-section of a semiconductor gate device in which the substrate has been damaged due to overetching.

Experiments have shown that the individual steps which make up the present invention yield faulty devices if they are performed alone. If a high selective nitride to oxide etch alone is used to remove all of the nitride 3, undercutting of the gate structures 4 tends to result, thereby causing faulty transistors 4. If, on the other hand, a low selective nitride to oxide etch alone is used to remove all of the nitride 3, most of the reoxidation layer 2 is also removed, and the substrate 1 below is consequently etched, and therefore damaged by the process, as shown in FIG. 4.

Poor nitride to oxide etches have resulted in low refresh times in DRAM semiconductor transistors because the substrate damage lessens the ability of the transistor to hold a charge. Since charge on the cell leaks more rapidly, more frequent refreshing of the cell is necessitated.

The process of the present invention overcomes the above-mentioned drawbacks. Hence, the process of the present invention results in improved semiconductor device functionality.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that the present invention is adaptable to the forming of spacers for other semiconductor devices.

What is claimed is:

1. A method of etching a substrate, said method comprising the following steps of:
   providing a substrate having at least one layer of oxide and at least one corresponding layer of nitride disposed over said at least one layer of oxide; exposing said substrate to a first atmosphere to remove a first portion of nitride, said first atmosphere comprising a fluorocarbon that provides a source of polymerizable elements during the removal of said first portion of nitride; and
   after said step of exposing said substrate to a first atmosphere, exposing said layered substrate to a second atmosphere different from said first atmosphere and having hydrogen halide, to selectively remove a second portion of nitride selectively with respect to said oxide, to expose a portion of said oxide layer.

2. The method of etching according to claim 1, wherein said hydrogen halide comprises at least one of HBr, HCl, and HI.

3. The method of etching according to claim 2, wherein said fluorocarbon comprises at least one of $CHF_3$ and $CF_4$.

4. The method of etching according to claim 3, wherein said second atmosphere further comprises $NF_3$.

5. The method of etching according to claim 4,
   wherein said substrate comprises features with horizontal surfaces; and
   wherein said first atmosphere and said second atmosphere provide primarily anisotropic etching to directionally remove portions of nitride material, said portions over horizontal surfaces of the features of said substrate.

6. The method of etching according to claim 4, wherein said first atmosphere anisotropically etches said layered substrate.

7. A method of etching a layered substrate, said method comprising steps of:

provoding a substrate having features with horizontal and vertical surfaces;

forming an oxide layer conformally over said substrate including said features;

providing a generally conformal nitride layer over said oxide layer;

exposing said layered substrate to a first atmosphere comprising fluorocarbons, to remove a first portion of nitride material of said nitride layer; and after said exposure to said first atmosphere, exposing the layered substrate to a second atmosphere different from said first atmosphere and having ionized hydrogen halide, to remove, selectively with respect to oxide, a second portion of nitride material of said nitride layer to expose a portion of said oxide layer at regions corresponding to the horizontal surfaces of said features of said base substrate while leaving nitride material adjacent the vertical surface of said features.

8. A method according to claim 7, wherein said first atmosphere comprises at least one fluorocarbon compound from the group of $CHF_3$ and $CF_4$, and provides primarily an anisotropic etch to remove said first portion of nitride material.

9. A method according to claim 8, wherein said second atmosphere further comprises $NF_3$, and provides primarily an anisotropic etch during the removal of said second portion of nitride material.

* * * * *